United States Patent
Li et al.

(10) Patent No.: US 12,206,231 B2
(45) Date of Patent: Jan. 21, 2025

(54) LEAKAGE CURRENT DETECTION AND INTERRUPTION DEVICE FOR POWER CORD AND RELATED ELECTRICAL CONNECTORS AND ELECTRICAL APPLIANCES

(71) Applicant: Chengli Li, Suzhou (CN)

(72) Inventors: Chengli Li, Suzhou (CN); Long Chen, Suzhou (CN); Guolan Yue, Suzhou (CN)

(73) Assignee: Chengli Li, Suzhou (CN)

( * ) Notice: Subject to any disclaimer, the term of this patent is extended or adjusted under 35 U.S.C. 154(b) by 120 days.

(21) Appl. No.: 17/706,138

(22) Filed: Mar. 28, 2022

(65) Prior Publication Data

US 2023/0307901 A1    Sep. 28, 2023

(30) Foreign Application Priority Data

Mar. 22, 2022    (CN) .......................... 202210286248.3
Mar. 22, 2022    (CN) .......................... 202220635960.5

(51) Int. Cl.
*H02H 3/08*      (2006.01)
*G01R 31/52*      (2020.01)
(Continued)

(52) U.S. Cl.
CPC .............. *H02H 3/08* (2013.01); *G01R 31/52* (2020.01); *H02H 1/0007* (2013.01); *H02H 7/008* (2013.01)

(58) Field of Classification Search
CPC ........ H02H 3/08; H02H 1/0007; H02H 7/008; G01R 31/52
(Continued)

(56) References Cited

U.S. PATENT DOCUMENTS 4,707,759 A    11/1987   Bodkin
5,708,364 A    1/1998   Vokey et al.
(Continued)

FOREIGN PATENT DOCUMENTS

KR    20180032018 A   *   3/2018
WO    2010011321 A1   †   1/2010

OTHER PUBLICATIONS

Vishay semiconductors VOM160 data sheet (Year: 2023).*

*Primary Examiner* — Thienvu V Tran
*Assistant Examiner* — Sreeya Sreevatsa
(74) *Attorney, Agent, or Firm* — Chen Yoshimura LLP

(57) ABSTRACT

A leakage current detection and interruption device includes a switch module for controlling electrical connection of power supply lines between input and output ends; a leakage current detection module, including first and second leakage current detection lines respectively covering the first and second power supply lines, to detect leakage current thereon and to generate respective first and second leakage signals in response thereto; a signal processing module, coupled to the leakage current detection module to receive the first and/or second leakage signals and to generate a leakage fault signal in response thereto; and a trigger module, coupled to the switch module and the signal processing module, to receive the leakage fault signal and in response thereto, to drive the switch module to disconnect the electrical connection to the output end. The device can detect current leaks on the two power supply lines and is simple, low-cost and reliable.

12 Claims, 6 Drawing Sheets

(51) Int. Cl.
*H02H 1/00* (2006.01)
*H02H 7/00* (2006.01)

(58) Field of Classification Search
USPC ........................................ 361/93.1
See application file for complete search history.

(56) References Cited

U.S. PATENT DOCUMENTS

| | | | |
|---|---|---|---|
| 6,697,238 B2* | 2/2004 | Bonilla | H02H 3/335 |
| | | | 361/104 |
| 8,605,402 B2 | 12/2013 | Ward et al. | |
| 8,853,539 B2 | 10/2014 | Ye et al. | |
| 9,312,680 B2 | 4/2016 | Li et al. | |
| 9,331,582 B2 | 5/2016 | Goerke | |
| 9,356,402 B2 | 5/2016 | Sung et al. | |
| 9,535,106 B2 | 1/2017 | Li | |
| 9,547,047 B2 | 1/2017 | Li et al. | |
| 9,564,119 B2 | 2/2017 | Ryu et al. | |
| 9,697,926 B2 | 7/2017 | Huang et al. | |
| 10,840,698 B2 | 11/2020 | Li et al. | |
| 10,886,724 B2 | 1/2021 | Li et al. | |
| 11,281,070 B2* | 3/2022 | Sun | G02F 1/3501 |
| 11,381,070 B1 | 7/2022 | Legatti | |
| 11,600,984 B1* | 3/2023 | Li | H01H 83/02 |
| 2005/0184761 A1* | 8/2005 | Isomura | H03K 17/302 |
| | | | 327/77 |
| 2006/0119997 A1 | 6/2006 | Lee | |
| 2006/0146456 A1 | 7/2006 | Williams | |
| 2006/0181820 A1* | 8/2006 | Elms | H02H 3/331 |
| | | | 361/42 |
| 2006/0198067 A1* | 9/2006 | Pearse | H02H 5/105 |
| | | | 361/42 |
| 2007/0159740 A1* | 7/2007 | Williams | H02H 3/33 |
| | | | 361/42 |
| 2008/0007878 A1* | 1/2008 | Gandolfi | H02H 3/14 |
| | | | 361/42 |
| 2008/0062593 A1 | 3/2008 | Li et al. | |
| 2008/0099227 A1 | 5/2008 | Zhang et al. | |
| 2010/0020452 A1* | 1/2010 | Gandolfi | H02H 3/16 |
| | | | 361/42 |
| 2010/0046128 A1* | 2/2010 | Wang | H01H 83/14 |
| | | | 361/42 |
| 2011/0061892 A1 | 3/2011 | Ye et al. | |
| 2011/0273813 A1* | 11/2011 | Huang | H01H 83/02 |
| | | | 361/170 |
| 2012/0119918 A1 | 5/2012 | Williams | |
| 2012/0249151 A1 | 10/2012 | Dobusch et al. | |
| 2014/0117995 A1 | 5/2014 | Topucharla | |
| 2015/0009592 A1* | 1/2015 | Aromin | H02H 3/162 |
| | | | 361/42 |
| 2015/0309105 A1* | 10/2015 | Ostrovsky | H02H 3/335 |
| | | | 324/509 |
| 2015/0349517 A1 | 12/2015 | Li et al. | |
| 2016/0111869 A1 | 4/2016 | Li et al. | |
| 2017/0222425 A1 | 8/2017 | Li et al. | |
| 2018/0292466 A1* | 10/2018 | Hackl | G01R 31/52 |
| 2019/0089074 A1 | 3/2019 | Oms | |
| 2019/0097412 A1 | 3/2019 | Li et al. | |
| 2019/0115748 A1 | 4/2019 | Li et al. | |
| 2020/0091707 A1 | 3/2020 | Li et al. | |
| 2020/0366083 A1 | 11/2020 | Li et al. | |
| 2020/0393520 A1* | 12/2020 | Li | G01R 31/58 |
| 2021/0006060 A1 | 1/2021 | Li et al. | |
| 2021/0027915 A1 | 1/2021 | Aromin et al. | |
| 2021/0125746 A1* | 4/2021 | Aromin | H01B 1/026 |
| 2021/0125753 A1 | 4/2021 | Aromin et al. | |
| 2021/0125754 A1 | 4/2021 | Aromin et al. | |
| 2021/0239770 A1 | 8/2021 | Li et al. | |
| 2022/0011378 A1 | 1/2022 | Li et al. | |
| 2024/0063631 A1* | 2/2024 | Zou | H02H 5/10 |

* cited by examiner
† cited by third party

LEAKAGE CURRENT DETECTION AND INTERRUPTION DEVICE FOR POWER CORD AND RELATED ELECTRICAL CONNECTORS AND ELECTRICAL APPLIANCES

BACKGROUND OF THE INVENTION

Field of the Invention

This invention relates to electrical circuits, and in particular, it relates to a leakage current detection and interruption (LCDI) device for a power cord, and related electrical connectors and electrical appliances.

Description of Related Art

Leakage current detection and interruption (LCDI) device is a fire hazard prevention device for electrical appliances. Its is implemented in a power cord with a plug, and functions to detect any leakage current between the hot and neutral power supply lines and their shield layers along the power cord from the plug to the electrical load (e.g., air conditioner, dehumidifier, etc.). When a leakage current is detected, the LCDI device can disconnect the electrical power from the power source to the appliance, preventing fire hazard and ensuring safety. Thus, LCDI devices can prevent fire hazard caused by arc fault due to physical damage and lost of insulation in the power cord, which may be caused by aging of the hot, neutral and ground wires, wear, pinching, animal chewing, etc.

The leakage current detection technique in conventional LCDI devices typically requires a pre-set detection voltage on the leakage current detection lines. Thus, even when no leakage current condition is present, the trigger electrode of the semiconductor devices of the tripping circuit still has a bias voltage applied to it, which presents a risk of accidental tripping of the LCDI device.

SUMMARY

Therefore, there is a need for an LCDI device that can detect the proper function of the leakage current detection lines.

To achieve the above objects, the present invention provides a leakage current detection and interruption device for a power cord, which includes: a switch module, configured to control an electrical connection of a first power supply line and a second power supply line between an input end and an output end; a leakage current detection module, including a first leakage current detection line and a second leakage current detection line, wherein the first leakage current detection line covers the first power supply line and is configured to detect a leakage current from the first power supply line and to generate a first leakage signal in response thereto, and wherein the second leakage current detection line covers the second power supply line and is configured to detect a leakage current from the second power supply line and to generate a second leakage signal in response thereto; a signal processing module, coupled to the leakage current detection module to receive the first and/or second leakage signals, and configured to generate a leakage fault signal in response to the first and/or second leakage signals; and a trigger module, coupled to the switch module and the signal processing module, configured to receive the leakage fault signal, and in response thereto, to drive the switch module to disconnect the electrical connection between the input end and the output end.

In some embodiments, the leakage current detection module is further configured to generate a first open-circuit signal in response to an open circuit condition in the first leakage current detection line, and to generate a second open-circuit signal in response to an open circuit condition in the second leakage current detection line.

In some embodiments, the signal processing module is further configured to receive the first and second open-circuit signals and to generate a self-test fault signal in response to the first and/or second open-circuit signal.

In some embodiments, the trigger module is further configured to receive the self-test fault signal, and in response thereto, to drive the switch module to disconnect the electrical connection between the input end and the output end.

In some embodiments, the leakage current detection and interruption device further includes a test module, which includes a test switch coupled to the leakage current detection module; wherein in response to the test switch being closed and the leakage current detection module having no fault condition, the trigger module is further configured to drive the switch module to disconnect the electrical connection between the input end and the output end.

In some embodiments, the leakage current detection module further includes: a self-test unit, coupled to the first leakage current detection line, the second leakage current detection line, the first power supply line, the second power supply line, the signal processing module, and the trigger module, configured to detect an open-circuit condition in the first and/or second leakage current detection line, to cooperate with the first leakage current detection line to generate the first open-circuit signal when the first leakage current detection line has an open-circuit condition, and to cooperate with the second leakage current detection line to generate the second open-circuit signal when the second leakage current detection line has an open-circuit condition.

In some embodiments, the signal processing module includes: a comparing unit, configured to define a threshold signal; wherein in response to an output signal from the leakage current detection module that is below the threshold signal, the signal processing module prevents the trigger module from driving the switch module to disconnect the electrical connection between the input end and the output end; and wherein in response to at least one of the first leakage signal, the second leakage signal, the first open-circuit signal, and the second open-circuit signal received from the leakage current detection module which is above the threshold signal, the comparing unit generates the leakage fault signal or the self-test fault signal correspondingly.

In some embodiments, the trigger module includes: a solenoid, configured to generate an electromagnetic force in response to a current flowing therethrough to drive the switch module; and at least one semiconductor device, coupled in series with the solenoid, and coupled to the signal processing module, configured to cause a current to flow through the solenoid in response to the leakage fault signal and/or the self-test fault signal.

In some embodiments, the comparing unit is selected from a group consisting of: a Zener diode, a trigger diode, a comparator, a TVS (Transient Voltage Suppressor) diode, and a photocoupler.

In some embodiments, the semiconductor device is selected from a group consisting of: a silicon controlled rectifier, a bipolar transistor, a field effect transistor, and a photocoupler.

In another aspect, the present invention provides an electrical power connection device, which includes: a body; the leakage current detection and interruption device according to any of the above embodiments, disposed inside the body.

In another aspect, the present invention provides an electrical appliance, which includes: an electrical load; and an electrical power connection device coupled between a power supply and the electrical load, configured to supply power to the electrical load, wherein the electrical power connection device includes the leakage current detection and interruption device according to any of the above embodiments.

In embodiments of the present invention, the two leakage current detection lines respectively cover the two power supply lines, and form a leakage current detection path, and can detect current leak on the two power supply lines as well as open-circuit conditions on the two leakage current detection lines. Further, the LCDI device according to embodiments of the present invention can effectively reduce or eliminate the occurrence of accidental trigger when no leakage is present on the power supply lines, caused by the bias voltage at the trigger (control) electrode of the semiconductor device of the drive circuit being too low. The LCDI device according to embodiments of the present invention has a simple circuit structure, is low-cost and reliable.

BRIEF DESCRIPTION OF THE DRAWINGS

Preferred embodiments of the present invention are described with reference to the drawings. These drawings explain the embodiments and their operating principle, and only illustrate structures that are necessary to the understanding of the invention. These drawings are not to scale. In the drawings, like features are designated by like reference symbols.

DETAILED DESCRIPTION OF PREFERRED EMBODIMENTS

Preferred embodiments of the present invention are described below with reference to the drawings. These drawings and descriptions explain embodiments of the invention but do not limit the invention. The described embodiments are not all possible embodiments of the present invention. Other embodiments are possible without departing from the spirit and scope of the invention, and the structure and/or logic of the illustrated embodiments may be modified. Thus, it is intended that the scope of the invention is defined by the appended claims.

Before describing the embodiments, some terms used in this disclosure are defined here to help the reader better understand this disclosure.

In this disclosure, terms such as "connect", "couple", "link" etc. should be understood broadly, without limitation to physical connection or mechanical connection, but can include electrical connection, and can include direct or indirection connections. Terms such as "a" and "one" do not limit the quantity, and refers to "at least one".

In the descriptions below, terms such as "including" are intended to be open-ended and mean "including without limitation", and can include other contents. "Based on" means "at least partly based on." "An embodiment" means "at least one embodiment." "Another embodiment" means "at least another embodiment," etc.

The main technical problem solved by embodiments of the present invention is the stability of the LCDI device.

To solve this technical problem, embodiments of the present invention provide a LCDI device, which includes: a switch module, configured to control electrical connection of the power supply lines between an input end and an output end; a leakage current detection module, including a first leakage current detection line which covers the first power supply line and is configured to detect a leakage current from the first power supply line and to generate a first leakage signal in response thereto, and a second leakage current detection line which covers the second power supply line and is configured to detect a leakage current from the second power supply line and to generate a second leakage signal in response thereto; a signal processing module, coupled to the leakage current detection module to receive the first and/or second leakage signals, and configured to generate a leakage fault signal in response to the first and/or second leakage signals; and a trigger module, coupled to the switch module and the signal processing module, configured to receive the leakage fault signal and in response thereto, to drive the switch module to disconnect the electrical connection between the input end and the output end.

Figure 1:
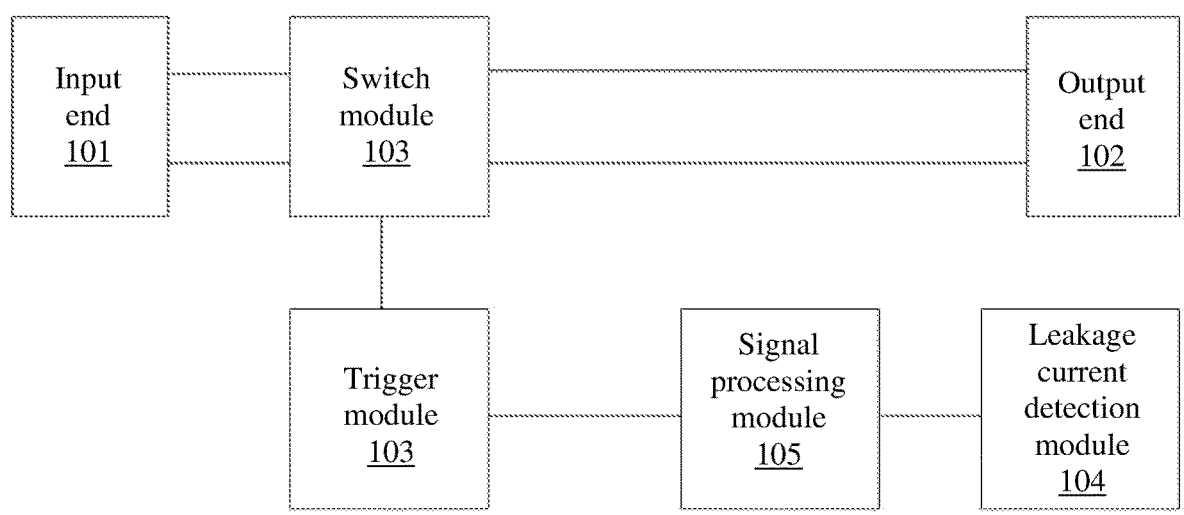
FIG. 1 is a block diagram of an LCDI device according to embodiments of the present invention.

FIG. 1 is a block diagram of an LCDI device according to embodiments of the present invention. As shown in FIG. 1, the LCDI device 100 includes a switch module 103, a leakage current detection module 104, a signal processing module 105, and a trigger module 106. The switch module 103 is located on the power supply lines and controls the electrical connection between the input end 101 and output end 102 of the power supply lines. The leakage current detection module 104 includes a first leakage current detection line and a second leakage current detection line. The first leakage current detection line covers the first power supply line in the power cord, and is configured to detect a first leakage current from the first power supply line and to generate a first leakage signal in response thereto. It is also configured to generate a first open-circuit signal when the first leakage current detection line has an open circuit condition. The second leakage current detection line covers the second power supply line in the power cord, and is configured to detect a second leakage current from the second power supply line and to generate a second leakage signal in response thereto. It is also configured to generate a second open-circuit signal when the second leakage current detection line has an open circuit condition.

The signal processing module 105 is coupled to the leakage current detection module 104 and the trigger module 106, and is configured to receive the first leakage signal and/or the second leakage signal, and the first open-circuit signal and/or the second open-circuit signal, and in response to one or more of the above signals, to generate a corresponding leakage fault signal and self-test fault signal. The trigger module 106 is coupled to the signal processing module 105 and the switch module 103, and controls the switch module 103 to disconnect the power supply to the output end in response to the leakage fault signal and self-test fault signal. In other words, any one of the first leakage signal, the second leakage signal, the first open-circuit signal, and the second open-circuit signal can cause the signal processing module 105 to generate a trigger signal to control the trigger module 106, which in turn drives the switch module 103 to disconnect the power supply.

When the first leakage current detection line generates the first leakage signal or the first open-circuit signal, and/or the second leakage current detection line generates the second leakage signal or the second open-circuit signal, the signals are inputted to the signal processing module 105. The signal processing module 105 compares the input signal to an internal threshold signal, and control the trigger module 106 accordingly to drive the switch module 103 to disconnect the power supply.

In the LCDI device 100, each leakage current detection line covers a corresponding power supply line and forms a leakage current detection path along with the signal processing module 105 and trigger module 106. Thus, the LCDI device 100 can detect leakage current from either of the two power supply lines and detect an open circuit condition of either of the two leakage current detection lines.

In some embodiments, the leakage current detection module 104 further includes a self-test unit (not shown in FIG. 1). The self-test unit is coupled to the first leakage current detection line, second leakage current detection line, signal processing module 105, trigger module 106, first power supply line and second power supply line, and configured to detect whether at least one of the first leakage current detection line and second leakage current detection line has an open circuit. It generates the first open-circuit signal in cooperation with the first leakage current detection line when the first leakage current detection line has an open circuit, and generates the second open-circuit signal in cooperation with the second leakage current detection line when the second leakage current detection line has an open circuit. By using the self-test unit, the LCDI device can detect whether the first leakage current detection line and second leakage current detection line has a fault (e.g., an open circuit), and can disconnect the power supply in response to the fault, thereby enhancing the reliability of the LCDI device 100.

In some embodiments, the signal processing module 105 includes at least one comparing unit (not shown in FIG. 1). The comparing unit has a threshold value; when the signal outputted by the leakage current detection module 104 is below the threshold value, the comparing unit prevents the trigger module 106 from driving the switch module 103 to disconnect the power. When at least one of the first leakage signal, second leakage signal, first open-circuit signal and second open-circuit signal outputted by the leakage current detection module 104 is above the threshold value, the comparing unit generates the leakage fault signal or the self-test fault signal. The comparing unit may be a Zener diode, a trigger diode, a comparator, a TVS (Transient Voltage Suppressor) diode, a photocoupler, etc.

In some embodiment, the trigger module 106 includes a solenoid and at least one semiconductor device. The solenoid is configured to generate a electromagnetic force to drive the switch module 103. The semiconductor device is coupled in series with the solenoid, and is coupled to the signal processing module 105. In response to the leakage fault signal and/or the self-test fault signal, the semiconductor device causes the solenoid to generate the electromagnetic force. The semiconductor device may be a silicon controlled rectifier, a bipolar transistor, a field effect transistor, a photocoupler, etc.

In some embodiments, the LCDI device 100 further includes a test module (not shown in FIG. 1). The test module includes a test switch coupled to the leakage current detection module 104. When the test switch is closed and the leakage current detection module 104 is functioning normally, the trigger module 106 drives the switch module 103 to disconnect power to the output end. When the test switch is closed but the leakage current detection module 104 has a fault, the switch module 103 maintains power supply to the output end. By using the test module, the device enables the use to manually test whether the current detection module 104 (the first and second leakage current detection lines) has a fault (e.g., open circuit). When there is a fault, the power supply to the output end is maintained when the test switch is pressed, which acts as warning to the user. This enhances the reliability of the LCDI device 100.

First Embodiment

Each of the above described modules is an electrical circuit.

Figure 2:
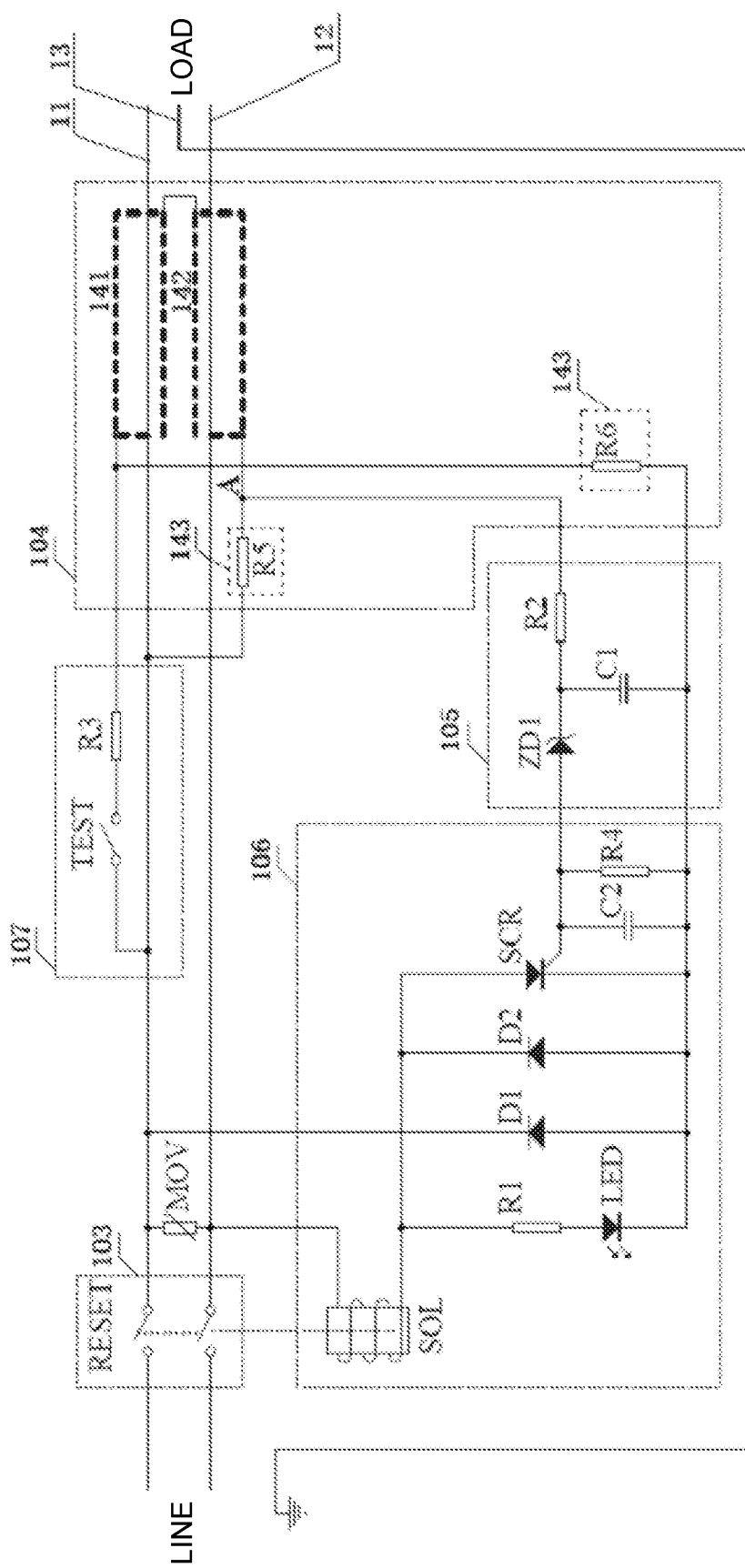
FIG. 2 is a circuit diagram of an LCDI device according to a first embodiment of the present invention.

FIG. 2 is a circuit diagram of an LCDI device according to a first embodiment of the present invention. As shown in FIG. 2, the LCDI device includes a switch module 103, a leakage current detection module 104, a signal processing module 105, a trigger module 106 and a test module 107. As shown in FIG. 2, the switch module 103 includes a reset switch RESET, located on the power supply lines to control the electrical connection between the input end LINE and output end LOAD. The power supply lines include a first power supply line 11 (hot), a second power supply line 12 (white or neutral) and a third power supply line 13 (ground). The leakage current detection module 104 includes at least a first leakage current detection line 141 and a second leakage current detection line 142, which respectively covers the first power supply line 11 and the second power supply line 12, and a self-test unit 143. In this embodiment, the first end of each of the first leakage current detection line 141 and second leakage current detection line 142 is the end farther away from the load LOAD, i.e. on the left-hand side of FIG. 2, while the second end of each of these lines is the end closer to the load LOAD, i.e. on the right-hand side of FIG. 2.

As shown in FIG. 2, the first leakage current detection line 141 and second leakage current detection line 142 are coupled in series. The first end the second leakage current detection line 142 is coupled to one end of a resistor R5 of the self-test unit 143 at point A. The other end of resistor R5 is coupled to the first power supply line 11, to which the reset switch RESET and one end of the test switch TEST are also coupled. The first end the first leakage current detection line 141 is coupled to one end of another resistor R6 of the self-test unit 143 and the test module 107. The second end of the first leakage current detection line 141 is coupled to the second end of the second leakage current detection line 142. In the signal processing module 105, a resistor R2 is coupled at one end to point A, and at another end to one end of a Zener diode ZD1. The other end of the Zener diode ZD1 is coupled to the control electrode of a silicon controlled rectifier SCR. In the trigger module 106, a capacitor is coupled between the control electrode and cathode of the silicon controlled rectifier SCR. The cathode of the silicon controlled rectifier SCR is coupled to the anodes of diodes D1 and D2, and the anode of the silicon controlled rectifier SCR is coupled to the cathode of diode D2 and one end of a solenoid SOL. The other end of the solenoid SOL is coupled to the second power supply line 12, to which the reset switch RESET is also coupled. The cathode of diode D1 is coupled to the first power supply line 11, to which the reset switch RESET is also coupled.

When both the first leakage current detection line 141 and second leakage current detection line 142 are operating normally (i.e., no open circuit condition), a current flows from the first power supply line 11 through a first current path formed by R5-142-141-R6-D2-SOL to the second power supply line 12. By setting the resistance values of resistors R5 and R6, the voltage at point A is limited to below the threshold voltage of the Zener diode ZD1; thus, the voltage at the control electrode of the silicon controlled rectifier SCR is limited to a very low level, which ensures that the silicon controlled rectifier SCR will not be accidentally triggered and the LCDI device will not be accidentally trip. In this condition, the switch module 103 is closed and the device functions normally to supply power to the load.

When there is current leak from the first power supply line 11 to the first leakage current detection line 141, the voltage at point A rises to above the threshold of the Zener diode ZD1. As a result, a current path is formed by 11-141-142-R2-ZD1, and the output voltage of the Zener diode ZD1 triggers the silicon controlled rectifier SCR to become conductive. Here, the elevated voltage at point A is the first leakage signal generated by the leakage current detection module 104 in response to the leak on the first power supply line 11, and the output voltage of the Zener diode ZD1 is the leakage fault signal generated by the signal processing module 105 in response to the first leakage signal. Similarly, when there is current leak between the second power supply line 12 and the second leakage current detection line 142, the voltage at point A (the second leakage signal) rises to above the threshold of the Zener diode ZD1. Thus, a current path is formed by 12-142-R2-ZD1, and the output voltage of the Zener diode ZD1 (the leakage fault signal) triggers the silicon controlled rectifier SCR to become conductive. When the silicon controlled rectifier SCR is conductive, a relatively large current flows through the solenoid SOL, generating a sufficiently large magnetic field to drive the reset switch RESET of the switch module 103 to trip, thereby disconnecting the electrical connection between the input end LINE and output end LOAD. This way, the LCDI device can detect the current leak of the first power supply line 11 and second power supply line 12.

When the first leakage current detection line 141 or second leakage current detection line 142 has an open circuit, resistor R6 loses the voltage division function, so the voltage at point A (the first or second open-circuit signal) rises to above the threshold of the Zener diode ZD1. Thus, a current path is formed by 11-R5-R2-ZD1, and the output voltage of the Zener diode ZD1 (the self-test fault signal) triggers the silicon controlled rectifier SCR to become conductive. As a result, the solenoid SOL drives the reset switch RESET of the switch module 103 to trip, thereby disconnecting the electrical connection between the input end LINE and output end LOAD. This way, the LCDI device can detect whether the first leakage current detection line 141 or second leakage current detection line 142 has a fault.

In addition to the self-test unit 143, the test module 107 may also be used to test whether the leakage current detection module 104 has a fault. In this embodiment, for the test module 107, a test current path 11-TEST-R3-141-142-R2-ZD1-SCR-D2-SOL-12 is formed.

When all components of the LCDI device are functioning normally and no leakage current is present between the first leakage current detection line 141 and first power supply line 11 or between second leakage current detection line 142 and the second power supply line 12, the Zener diode ZD1 cannot trigger the silicon controlled rectifier SCR to become conductive, and the LCDI device functions normally to supply power to the output end.

In the normal condition, when the test switch TEST is manually depressed (closed) by a user, a current flows through the above test current path, causing the Zener diode ZD1 to trigger the silicon controlled rectifier SCR to conduct. As a result, the solenoid SOL drives the reset switch RESET to trip, thereby disconnecting power to the output end. On the other hand, when any component of the above test current path is faulty (open circuit), then the current cannot flow through the test current path when the test switch TEST is closed. As a result, the silicon controlled rectifier SCR cannot be triggered to conduct, so the solenoid SOL does not drive the reset switch RESET to disconnect power to the output end. This indicates to the user that the device is faulty and should not be used. This way, the user can operate the test switch TEST to determine whether the LCDI device is functioning normally.

Figure 3:
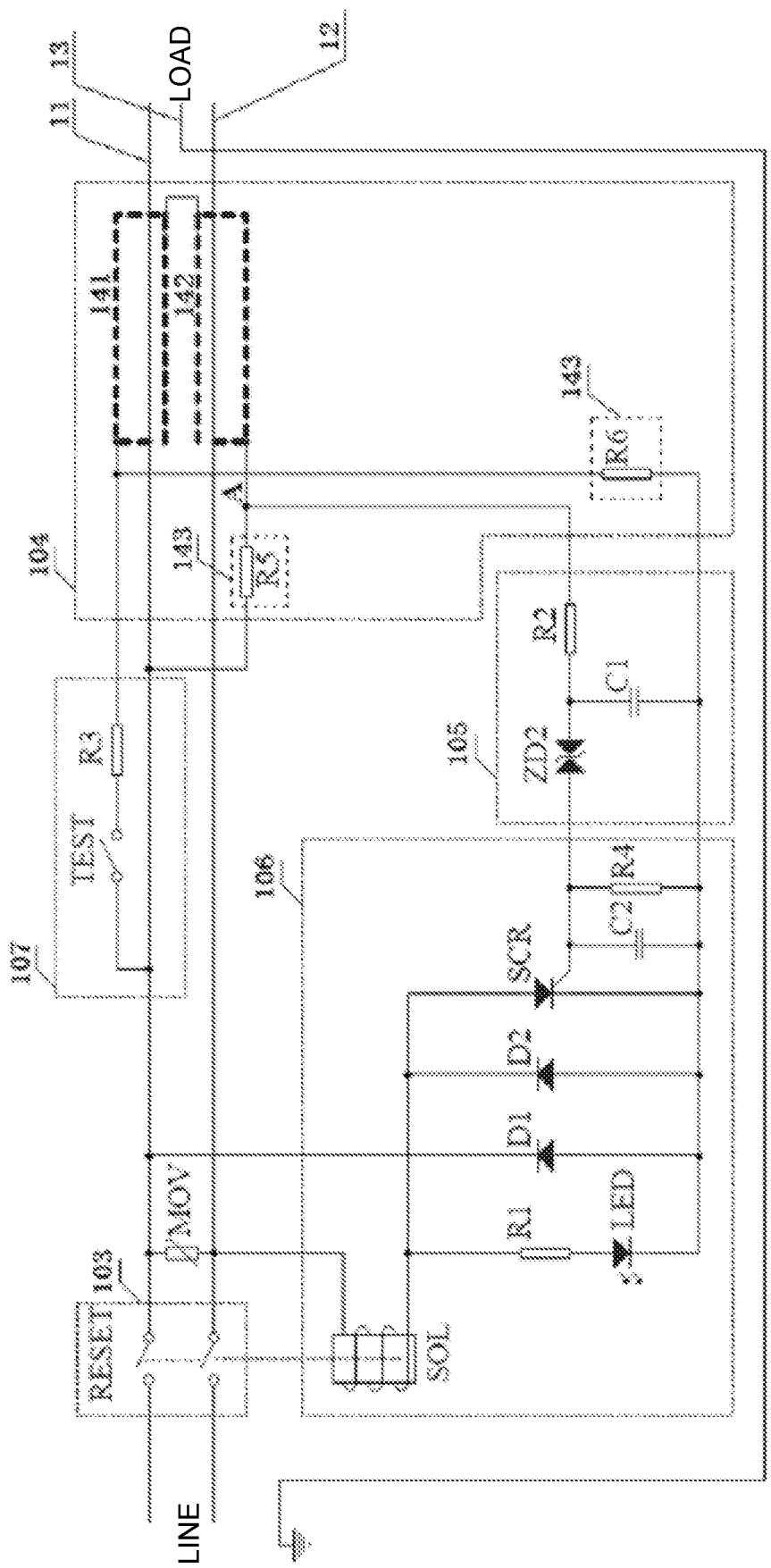
FIG. 3 is a circuit diagram of an LCDI device according to a second embodiment of the present invention.

FIG. 3 is a circuit diagram of an LCDI device according to a second embodiment of the present invention. Compared to the embodiment of FIG. 2, the main difference is that the Zener diode ZD1 which acts as a comparing unit in the signal processing module 105 in FIG. 2 is changed to a trigger diode ZD2. The leakage current detection principle of the leakage current detection module 104 for detecting leakage current in the first power supply line 11 and second power supply line 12, as well as the fault detection principle of the self-test unit 143, signal processing module 105 and test module 107 for detecting fault in the leakage current detection module 104, are similar to or the same as those of the embodiment of FIG. 2 and are further descriptions are omitted here.

Figure 4:
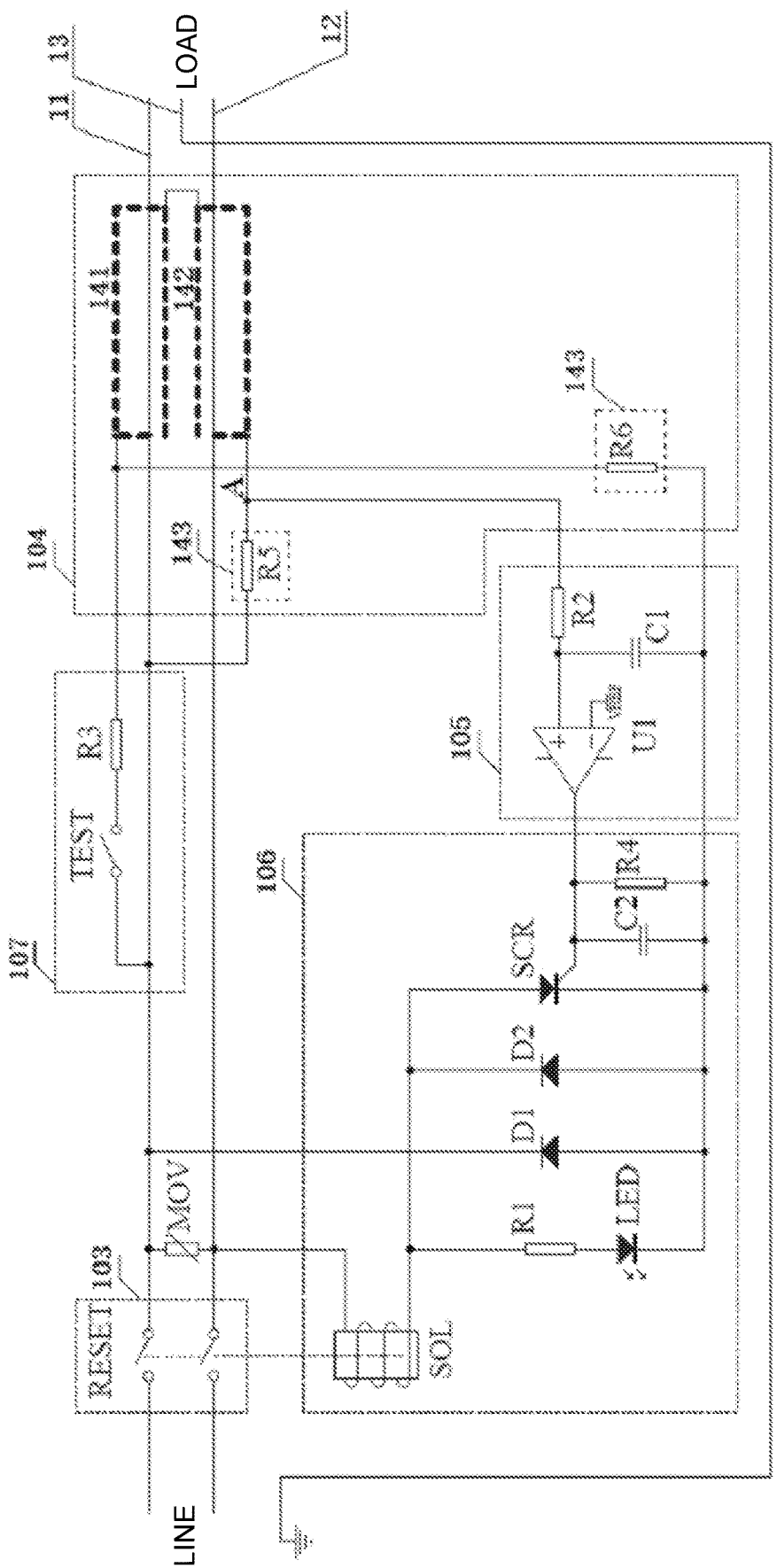
FIG. 4 is a circuit diagram of an LCDI device according to a third embodiment of the present invention.

FIG. 4 is a circuit diagram of an LCDI device according to a third embodiment of the present invention. Compared to the embodiment of FIG. 2, the main difference is that the Zener diode ZD1 which acts as a comparing unit in the signal processing module 105 in FIG. 2 is changed to a comparator U1. The leakage current detection principle of the leakage current detection module 104 for detecting leakage current in the first power supply line 11 and second power supply line 12, as well as the fault detection principle of the self-test unit 143, signal processing module 105 and test module 107 for detecting fault in the leakage current detection module 104, are similar to or the same as those of the embodiment of FIG. 2 and are further descriptions are omitted here.

Figure 5:
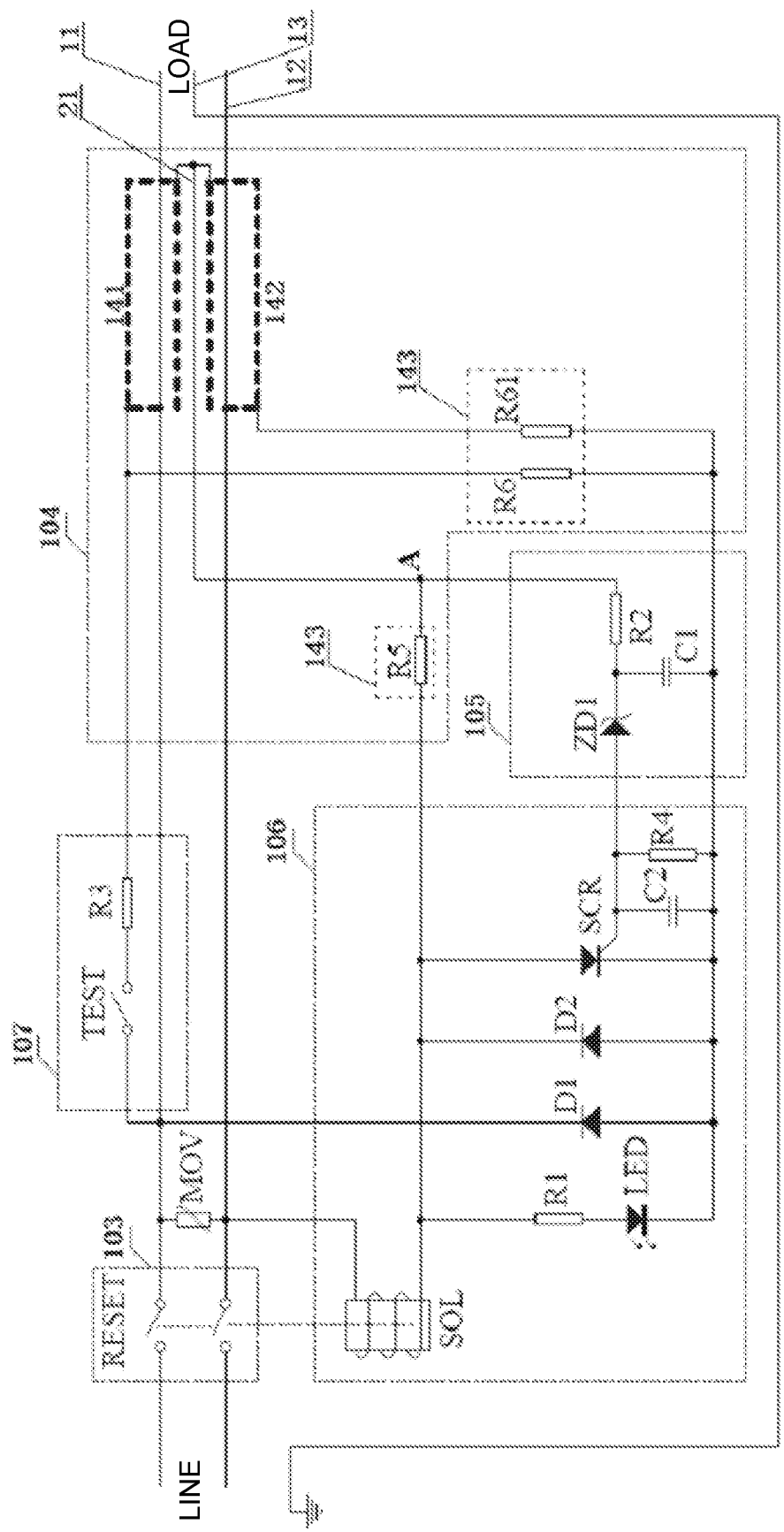
FIG. 5 is a circuit diagram of an LCDI device according to a fourth embodiment of the present invention.

FIG. 5 is a circuit diagram of an LCDI device according to a fourth embodiment of the present invention. Compared to the embodiment of FIG. 2, the main difference is in the leakage current detection module 104. In the embodiment of FIG. 5, the leakage current detection module 104 includes a first leakage current detection line 141, a second leakage current detection line 142, a connector line 21, and a self-test unit 143. The first leakage current detection line 141 covers the first power supply line 11, and the second leakage current detection line 142 covers the second power supply line 12. Similar to the embodiment of FIG. 2, in this embodiment, the first end of each of the first leakage current detection line 141, second leakage current detection line 142 and connector line 21 is the end farther away from the load LOAD, i.e.

on the left-hand side of FIG. 5, while the second end of each of these lines is the end closer to the load LOAD, i.e. on the right-hand side of FIG. 5.

As shown in FIG. 5, the second end of the first leakage current detection line 141, the second end of the second leakage current detection line 142, and the second end of the connector line 21 are coupled to each other. The first end of the first leakage current detection line 141 is coupled to the test module 107 and to one end of a resistor R6 of the self-test unit 143. The first end of the connector line 21 is coupled to one end of a resistor R5 of the self-test unit 143 at point A. The other end of resistor R5 is coupled to one end of the solenoid SOL. The other end of the solenoid SOL is coupled to the second power supply line 12, to which the reset switch RESET is also coupled. The first end the second leakage current detection line 142 is coupled to one end of another resistor R61 of the self-test unit 143; the other end of resistor R61 is coupled to the other end of resistor R6. In the signal processing module 105, a resistor R2 is coupled at one end to point A, and at another end to one end of a Zener diode ZD1 which acts as a comparing unit. The other end of the Zener diode ZD1 is coupled to the control electrode of a silicon controlled rectifier SCR. In the trigger module 106, a capacitor C2 is coupled between the control electrode and cathode of the silicon controlled rectifier SCR. The cathode of the silicon controlled rectifier SCR is also coupled to the anodes of diodes D1 and D2, and the anode of the silicon controlled rectifier SCR is coupled to the cathode of diode D2 and one end of a solenoid SOL. The cathode of diode D1 is coupled to the first power supply line 11, to which the reset switch RESET is also coupled.

When both the first leakage current detection line 141 and second leakage current detection line 142 are operating normally (i.e., no open circuit condition), a current flows from the second power supply line 12 through a current path formed by SOL-R5-21-141-R6-D1 to the first power supply line 11. Similarly, a current also flows from the second power supply line 12 through a current path formed by SOL-R5-21-142-R61-D1 to the first power supply line 11. The resistors R6 and R61 are in a parallel relationship. By setting the resistance values of resistors R5, R6 and R61, the voltage at point A is limited to below the threshold voltage of the Zener diode ZD1, which is insufficient to trigger the silicon controlled rectifier SCR via resistor R2 and Zener diode ZD1. In this condition, the switch module 103 is closed and the device functions normally to supply power to the load.

When there is current leak from the first power supply line 11 to the first leakage current detection line 141 or from the second power supply line 12 to the second leakage current detection line 142, the voltage at point A (the first or second leakage signal) rises to above the threshold of the Zener diode ZD1. As a result, a current path is formed by 11-141 or 142-R2-ZD1, and the output voltage of the Zener diode ZD1 (the leakage fault signal) triggers the silicon controlled rectifier SCR to become conductive. As a result, a relatively large current flows through the solenoid SOL, generating a sufficiently large magnetic field to drive the reset switch RESET of the switch module 103 to trip, thereby disconnecting the electrical connection between the input end LINE and output end LOAD. This way, the LCDI device can detect the current leak of the first power supply line 11 and second power supply line 12.

When the first leakage current detection line 141 or second leakage current detection line 142 has an open circuit, resistor R6 and/or R61 loses the voltage division function, so the voltage at point A (the first or second open-circuit signal) rises to above the threshold of the Zener diode ZD1. Thus, a current path is formed by 12-SOL-R5-R2-ZD1, and the output voltage of the Zener diode ZD1 (the self-test fault signal) triggers the silicon controlled rectifier SCR to become conductive. As a result, the solenoid SOL drives the reset switch RESET of the switch module 103 to trip, thereby disconnecting the electrical connection between the input end LINE and output end LOAD. This way, the LCDI device can detect whether the first leakage current detection line 141 or second leakage current detection line 142 has a fault.

In addition to the self-test unit 143, the test module 107 may also be used to test whether the leakage current detection module 104 has a fault. In this embodiment, for the test module 107, a test current path 11-TEST-R3-141-21-R2-ZD1-SCR-D2-SOL-12 is formed.

When all components of the LCDI device are functioning normally and no leakage current is present between the first leakage current detection line 141 and first power supply line 11 or between second leakage current detection line 142 and the second power supply line 12, the silicon controlled rectifier SCR is not triggered to become conductive, and the LCDI device functions normally to supply power to the output end.

When the test switch TEST is manually depressed (closed) by a user, a current flows through the above test current path, and the Zener diode ZD1 trigger the silicon controlled rectifier SCR to conduct. As a result, the solenoid SOL drives the reset switch RESET to trip, thereby disconnecting power to the output end. On the other hand, when any component of the above test current path is faulty (open circuit), then the current cannot flow through the test current path when the test switch TEST is closed. As a result, the silicon controlled rectifier SCR cannot be triggered to conduct, so the solenoid SOL does not drive the reset switch RESET to disconnect power to the output end. This indicates to the user that the device is faulty and should not be used.

Figure 6:
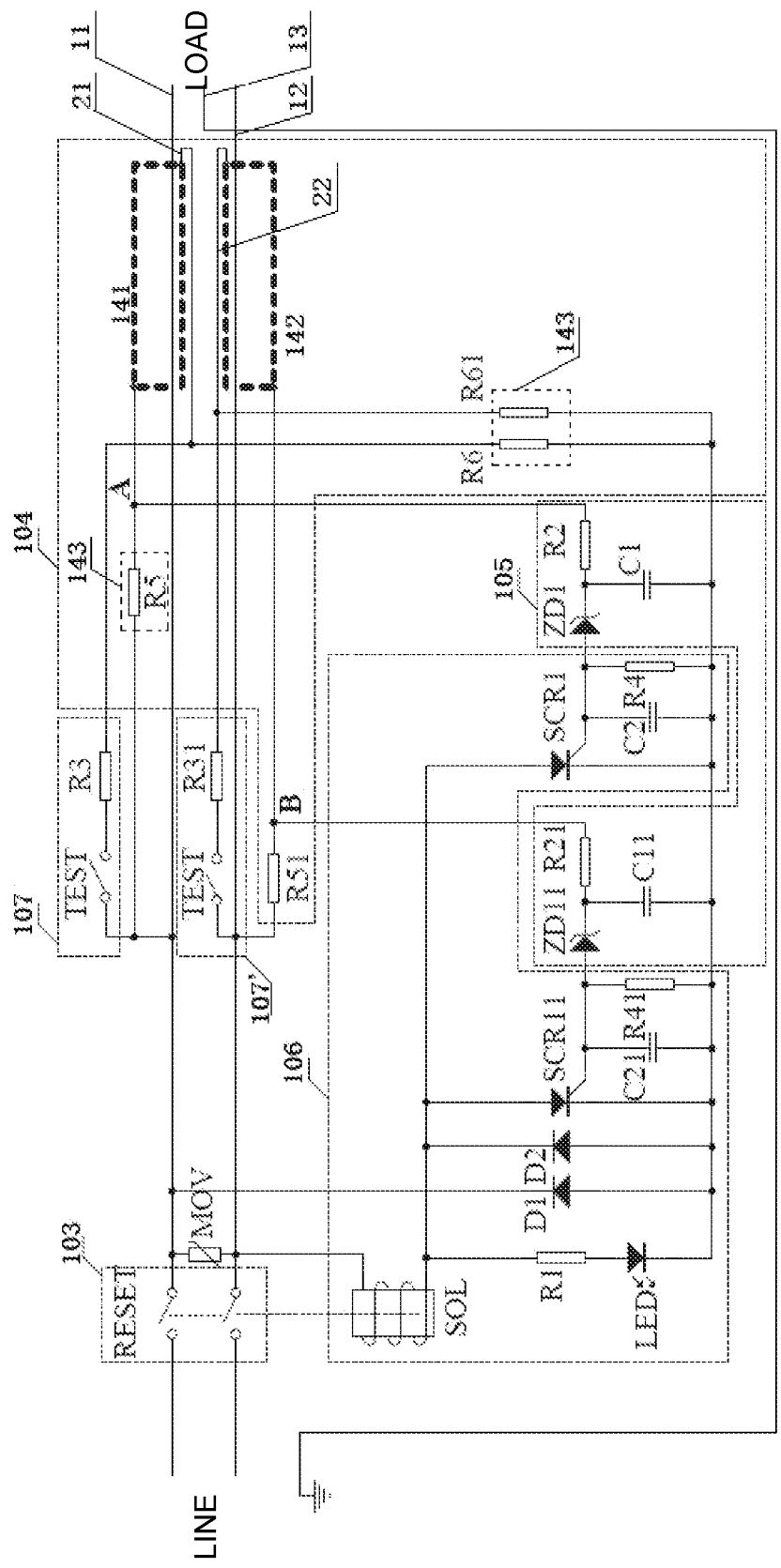
FIG. 6 is a circuit diagram of an LCDI device according to a fifth embodiment of the present invention.

FIG. 6 is a circuit diagram of an LCDI device according to a fifth embodiment of the present invention. In the embodiment of FIG. 6, the leakage current detection module 104 includes first leakage current detection line 141, second leakage current detection line 142, first and second connector lines 21 and 22, and self-test unit 143. The first leakage current detection line 141 covers the first power supply line 11, and the second leakage current detection line 142 covers the second power supply line 12. In this embodiment, the first end of each of the first leakage current detection line 141, second leakage current detection line 142 and connector lines 21 an 22 is the end farther away from the load LOAD, i.e. on the left-hand side of FIG. 6, while the second end of each of these lines is the end closer to the load LOAD, i.e. on the right-hand side of FIG. 6.

The second end of the first leakage current detection line 141 is coupled to the second end of the first connector line 21, and the second end of the second leakage current detection line 142 is coupled to the second end of the second connector line 22. The first end of the first leakage current detection line 141 is coupled to one end of a resistor R5 of the self-test unit 143 at point A. The first end of the second leakage current detection line 142 is coupled to one end of another resistor R51 of the self-test unit 143 at point B. The first end of the first connector line 21 is coupled between resistors R3 and R6, and the first end of the second connector line 22 is coupled between resistors R31 and R61. In the signal processing module 105, a resistor R2 is coupled at one end to point A, and another to a Zener diode ZD1 which acts as a first comparing unit; another resistor R21 is coupled at one end to point B, and at another to another Zener diode ZD11 which acts as a second comparing unit. In the trigger module 106, a first silicon controlled rectifier SCR1 is coupled at its control electrode to the Zener diode ZD1, and a capacitor C2 is coupled between the control electrode and cathode of the silicon controlled rectifier SCR1. Another silicon controlled rectifier SCR11 is coupled at its control electrode to the other Zener diode ZD11, and another capacitor C21 is coupled between the control electrode and cathode of the other silicon controlled rectifier SCR11.

When all of the first leakage current detection line 141, second leakage current detection line 142, and connector lines 21 and 22 are operating normally (i.e., no open circuit condition), a current flows from the first power supply line 11 through a first current path formed by R5-141-21-R6-D2-SOL to the second power supply line 12. By setting the resistance values of resistors R5 and R6, the voltage at point A is limited to below the threshold voltage of the Zener diode ZD1, and is insufficient to trigger the silicon controlled rectifier SCR1 via resistor R2 and Zener diode ZD1. Similarly, a current flows from the second power supply line 12 through a second current path formed by R51-142-22-R61-D1 to the first power supply line 11. By setting the resistance values of resistors R51 and R61, the voltage at point B is limited to below the threshold voltage of the Zener diode ZD11, and is insufficient to trigger the silicon controlled rectifier SCR11 via resistor R21 and Zener diode ZD11. In this condition, the switch module 103 is closed and the device functions normally to supply power to the load.

When there is current leak from the first power supply line 11 to the first leakage current detection line 141, the voltage at point A (the first leakage signal) rises to above the threshold of the Zener diode ZD1. As a result, a current path is formed by 11-141-R2-ZD1, and the output voltage of the Zener diode ZD1 (the leakage fault signal) triggers the silicon controlled rectifier SCR1 to become conductive. Similarly, when there is current leak from the second power supply line 12 to the second leakage current detection line 142, the voltage at point B (the second leakage signal) rises to above the threshold of the Zener diode ZD1. As a result, a current path is formed by 12-142-R21-ZD11, and the output voltage of the Zener diode ZD11 (the leakage fault signal) triggers the silicon controlled rectifier SCR11 to become conductive. When either silicon controlled rectifier SCR1 or SCR11 is conductive, a relatively large current flows through the solenoid SOL, generating a sufficiently large magnetic field to drive the reset switch RESET of the switch module 103 to trip, thereby disconnecting the electrical connection between the input end LINE and output end LOAD. This way, the LCDI device can detect the current leak of the first power supply line 11 and second power supply line 12.

When the first leakage current detection line 141 has an open circuit, resistor R6 loses the voltage division function, so the voltage at point A (the first open-circuit signal) rises to above the threshold voltage of the Zener diode ZD1. Thus, a current path is formed by 11-R5-R2-ZD1, and the output voltage of the Zener diode ZD1 (the self-test fault signal) triggers the silicon controlled rectifier SCR1 to become conductive. Similarly, when the second leakage current detection line 142 has an open circuit, resistor R61 loses the voltage division function, so the voltage at point B (the second open-circuit signal) rises to above the threshold voltage of the other Zener diode ZD11. Thus, a current path is formed by 12-R51-R21-ZD11, and the output voltage of the Zener diode ZD11 (the self-test fault signal) triggers the other silicon controlled rectifier SCR11 to become conductive. When either silicon controlled rectifier SCR1 or SCR11 is conductive, the solenoid SOL drives the reset switch RESET of the switch module 103 to trip, thereby disconnecting the electrical connection between the input end LINE and output end LOAD. This way, the LCDI device can individually detect whether the first leakage current detection line 141 or second leakage current detection line 142 has a fault.

In addition to the self-test unit 143, first and second test modules 107 and 107' may also be used to test whether the leakage current detection module 104 has a fault. In this embodiment, for the first test module 107, a first test current path 11-TEST-R3-21-141-R2-ZD1-SCR-D2-SOL-12 is formed. For the second test module 107', a second test current path 12-TEST-R31-22-142-R21-ZD11-SCR11-D1-11 is formed.

When the first leakage current detection line 141, second leakage current detection line 142, and connector lines 21 and 22 are all functioning normally and no leakage current is present between the first leakage current detection line 141 and first power supply line 11 or between second leakage current detection line 142 and the second power supply line 12, the silicon controlled rectifiers SCR1 and SCR11 cannot be triggered to become conductive, and the LCDI device functions normally to supply power to the output end.

When the test switch TEST of the first test module 107 is manually depressed (closed) by a user, a current flows through the above first test current path, causing the silicon controlled rectifier SCR1 to be triggered to conduct. As a result, the solenoid SOL drives the reset switch RESET to trip, thereby disconnecting power to the output end. On the other hand, when any component of the above first test current path is faulty (open circuit), then the current cannot flow through the first test current path when the test switch TEST is closed. As a result, the silicon controlled rectifier SCR1 cannot be triggered to conduct, so the solenoid SOL does not drive the reset switch RESET to disconnect power to the output end. This indicates to the user that the device is faulty and should not be used.

Similarly, when the test switch TEST of the second test module 107' is manually depressed (closed) by a user, a current flows through the above second test current path, causing the other silicon controlled rectifier SCR11 to be triggered to conduct. As a result, the solenoid SOL drives the reset switch RESET to trip, thereby disconnecting power to the output end. On the other hand, when any component of the above second test current path is faulty (open circuit), then the current cannot flow through the second test current path when the test switch TEST is closed. As a result, the silicon controlled rectifier SCR11 cannot be triggered to conduct, so the solenoid SOL does not drive the reset switch RESET to disconnect power to the output end. This indicates to the user that the device is faulty and should not be used.

Some additional embodiments of the present invention provide an electrical power connection device, which includes a body and an LCDI device according to any one of the above embodiments disposed inside the body.

Other additional embodiments of the present invention provide an electrical appliance, which includes an electrical load, and an electrical power connection device coupled between a power supply source and the load to supply power to the load, where the electrical power connection device employs an LCDI device according to any one of the above embodiments.

While the present invention is described above using specific examples, these examples are only illustrative and do not limit the scope of the invention. It will be apparent to those skilled in the art that various modifications, additions and deletions can be made to the leakage current detection and interruption device of the present invention without departing from the spirit or scope of the invention.

What is claimed is:

1. A leakage current detection and interruption device for a power cord, comprising:
   a first power supply line and a second power supply line;
   a switch module, configured to control an electrical connection of the first power supply line and the second power supply line between an input end and an output end;
   a leakage current detection module, including a first leakage current detection line and a second leakage current detection line, wherein the first leakage current detection line covers the first power supply line and is configured to detect a leakage current from the first power supply line and to generate a first leakage signal in response thereto, and wherein the second leakage current detection line covers the second power supply line and is configured to detect a leakage current from the second power supply line and to generate a second leakage signal in response thereto;
   a signal processing module, coupled to the leakage current detection module to receive the first and/or second leakage signals, and configured to generate a leakage fault signal in response to the first and/or second leakage signals, wherein the signal processing module includes a comparing unit configured to have a threshold signal, the comparing unit being selected from a group consisting of: a Zener diode, a trigger diode, and a TVS (Transient Voltage Suppressor) diode, wherein the threshold signal is defined by the Zener diode or the trigger diode or the TVS diode;
   a trigger module, coupled to the switch module and the signal processing module, configured to receive the leakage fault signal, and in response thereto, to drive the switch module to disconnect the electrical connection between the input end and the output end; and
   wherein in response to an output signal from the leakage current detection module that is below the threshold signal, the signal processing module prevents the trigger module from driving the switch module to disconnect the electrical connection between the input end and the output end, and in response to at least one of the first leakage signal and the second leakage signal received from the leakage current detection module which is above the threshold signal, the comparing unit generates the leakage fault signal.

2. The leakage current detection and interruption device of claim 1, wherein the leakage current detection module is further configured to generate a first open-circuit signal in response to an open circuit condition in the first leakage current detection line, and to generate a second open-circuit signal in response to an open circuit condition in the second leakage current detection line.

3. The leakage current detection and interruption device of claim 2, wherein the signal processing module is further configured to receive the first and second open-circuit signals and to generate a self-test fault signal in response to the first and/or second open-circuit signal.

4. The leakage current detection and interruption device of claim 3, wherein the trigger module is further configured to receive the self-test fault signal, and in response thereto, to drive the switch module to disconnect the electrical connection between the input end and the output end.

5. The leakage current detection and interruption device of claim 4, wherein the trigger module includes:
   a solenoid, configured to generate an electromagnetic force in response to a current flowing therethrough to drive the switch module; and
   at least one semiconductor device, coupled in series with the solenoid, and coupled to the signal processing module, configured to cause a current to flow through the solenoid in response to the leakage fault signal and/or the self-test fault signal.

6. The leakage current detection and interruption device of claim 3,
   wherein in response to at least one of the first open-circuit signal and the second open-circuit signal received from the leakage current detection module which is above the threshold signal, the comparing unit generates the self-test fault signal.

7. The leakage current detection and interruption device of claim 2, wherein the leakage current detection module further includes:
   a self-test unit, coupled to the first leakage current detection line, the second leakage current detection line, the first power supply line, the second power supply line, the signal processing module, and the trigger module, configured to detect an open-circuit condition in the first and/or second leakage current detection line, to cooperate with the first leakage current detection line to generate the first open-circuit signal when the first leakage current detection line has an open-circuit condition, and to cooperate with the second leakage current detection line to generate the second open-circuit signal when the second leakage current detection line has an open-circuit condition.

8. The leakage current detection and interruption device of claim 1, further comprising a test module, which includes a test switch coupled to the leakage current detection module;
   wherein in response to the test switch being closed and the leakage current detection module having no fault condition, the trigger module is further configured to drive the switch module to disconnect the electrical connection between the input end and the output end.

9. The leakage current detection and interruption device of claim 1, wherein the trigger module includes:
   a solenoid, configured to generate an electromagnetic force in response to a current flowing therethrough to drive the switch module; and
   at least one semiconductor device, coupled in series with the solenoid, and coupled to the signal processing module, configured to cause a current to flow through the solenoid in response to the leakage fault signal.

10. The leakage current detection and interruption device of claim 9, wherein the semiconductor device is selected from a group consisting of: a silicon controlled rectifier, a bipolar transistor, a field effect transistor, and a photocoupler.

11. An electrical power connection device, comprising:
    a body; and
    the leakage current detection and interruption device of claim 1, disposed inside the body.

12. An electrical appliance, comprising:
    an electrical load; and
    an electrical power connection device coupled between a power supply and the electrical load, configured to supply power to the electrical load, wherein the electrical power connection device includes the leakage current detection and interruption device of claim 1.

\* \* \* \* \*